(12) United States Patent
Chang (10) Patent No.: US 6,720,210 B1
(45) Date of Patent: Apr. 13, 2004

(54) MASK ROM STRUCTURE AND MANUFACTURING METHOD THEREOF

(75) Inventor: Ching-Yu Chang, Yilan Hsien (TW)

(73) Assignee: Macronix International Co., Ltd, Hsinchu (TW)

( * ) Notice: Subject to any disclaimer, the term of this patent is extended or adjusted under 35 U.S.C. 154(b) by 0 days.

(21) Appl. No.: 10/065,431

(22) Filed: Oct. 17, 2002

(51) Int. Cl.[7] ............................................... H01L 21/82
(52) U.S. Cl. .................. 438/128; 438/129; 438/130; 438/217; 438/275; 438/276; 438/289; 257/390; 257/391
(58) Field of Search ................................. 257/128–130, 257/217, 275, 276, 278, 289, 290, 390, 391

(56) References Cited

U.S. PATENT DOCUMENTS 5,837,426 A * 11/1998 Tseng et al. ................. 430/311
5,854,109 A * 12/1998 Sheng et al. ................. 438/275
6,133,103 A * 10/2000 Lee et al. .................... 438/276
6,420,237 B1 * 7/2002 Chang ......................... 438/300

* cited by examiner

Primary Examiner—Son L. Mai
Assistant Examiner—Andy Huynh
(74) Attorney, Agent, or Firm—Jiang Chyun IP Office (57) ABSTRACT

A mask read-only-memory structure and its method of manufacture are provided. The structure includes a substrate, a buried bit line in the substrate and a patterned stack layer covering a portion of the upper surface of the substrate. The stack layer includes a first dielectric layer, a stopping layer and a second dielectric layer. A gate oxide layer covers a portion of the upper surface of the substrate. A word line runs across the buried bit line to form a plurality of coding cells. The memory cells having a stack layer thereon are at a logic state "0" while the memory cells having a gate oxide layer thereon are at a logic state "1".

10 Claims, 7 Drawing Sheets

MASK ROM STRUCTURE AND MANUFACTURING METHOD THEREOF

BACKGROUND OF INVENTION

1. Field of Invention

The present invention relates to a memory structure and a manufacturing method thereof. More particularly, the present invention relates to a mask read-only-memory (mask ROM) structure and its method of manufacture.

2. Description of Related Art

Most mask read-only-memory (mask ROM) comprises a plurality of bit lines (BL) and a plurality of word lines (WL) running across and above the bit lines. The channel region of each memory cell is located underneath the word lines and between two neighboring bit lines. For some mask ROM, programming involves planting ions into some of the memory cell channels so that a data bit "1" or "0" is stored in the memory cell. The process of planting ions into specified channel regions is often called a coding implant.

In general, the coding implant for a mask ROM is carried out in a few steps. First, a photoresist layer is formed over a substrate and the photoresist layer is patterned using a photomask so that the channel regions where an ion implantation is desired are exposed. Thereafter, using the patterned photoresist layer as a mask, ions are implanted into the exposed channel regions. However, the photomask that serves as a coding mask in the code implant process for producing the mask ROM may contain both isolated pattern regions and dense pattern regions. While transferring the pattern in a photo-exposure operation, average intensity of the light falling on the photoresist in the isolated pattern regions is stronger than average intensity of light falling on the dense pattern regions. Consequently, critical dimensions of the exposed pattern may deviate from the standard values due to optical proximity effect (OPE) between the isolated pattern regions and the dense pattern regions. Thus, when ions are implanted into the designated channel regions to program the mask ROM, misalignment of the implanted ions may occur leading to possible data error in some ROM cells. As a result, operating properties of each ROM cell may vary and overall reliability of the mask ROM may drop.

To minimize the non-uniformity of critical dimensions after pattern exposure due to the presence of both dense pattern regions and isolated pattern regions in the coding mask, an optical proximity correction (OPC) method or a phase shift mask (PSM) technique is often deployed. In the optical proximity correction (OPC) method, a specially designed auxiliary pattern is introduced to eliminate critical dimension deviation caused by proximity effect. However, to implement the correction, a photomask with specially designed pattern must be produced. Since the photomask is expensive and difficult to make, overall production cost is increased. Moreover, debugging the defects in the pattern after fabrication is extremely difficult.

Furthermore, if the coding mask in the coding implant process is misaligned or if the critical dimensions have some deviation, the coding ions originally intended for the channel regions may diffuse into the buried bit lines. When this happens, ion concentration within the buried bit lines may change leading to a reduction of current flow in the buried bit lines.

SUMMARY OF INVENTION

Accordingly, one object of the present invention is to provide a mask read-only-memory (mask ROM) structure and its method of manufacture capable of preventing the diffusion of coding ions into buried bit lines in the mask ROM and the subsequent reduction of current flow in the buried bit lines.

A second object of this invention is to provide a mask read-only-memory structure and its method of manufacture capable of preventing critical dimension deviations in isolated pattern regions and dense pattern regions when a conventional coding implant process for programming the memory cells inside the mask ROM is deployed.

A third object of this invention is to provide a mask read-only-memory structure and its method of manufacture capable of programming the mask ROM while employing neither the optical proximity method nor the phase shifting mask technique, thereby reducing production cost.

To achieve these and other advantages and in accordance with the purpose of the invention, as embodied and broadly described herein, the invention provides a mask read-only-memory (mask ROM) structure. The mask ROM includes a substrate, a buried bit line, a patterned stack layer, a gate oxide layer and a word line. The buried bit line is embedded inside the substrate. The stack layer covers a portion of the upper surface of the substrate. The stack layer comprises a first dielectric layer, a stopping layer and a second dielectric layer. In this invention, the first dielectric layer and the second dielectric layer are, for example, silicon oxide layer. The stopping layer is, for example, a silicon nitride layer or a silicon oxynitride layer. The gate oxide layer covers a portion of the upper surface of the substrate. The word line runs over and across the buried bit line to form a plurality of coding memory cells. Among the coding cells, the ones having a stack layer thereon are at a logic state "0" while the ones having a gate oxide layer thereon are at a logic state "1".

This invention also provides a method of manufacturing a mask read-only-memory (mask ROM). A first dielectric layer, a stopping layer and a second dielectric layer are sequentially formed over a substrate to form a stack layer. The first dielectric layer and the second dielectric layer are silicon oxide layers and the stopping layer is a silicon nitride or a silicon oxynitride layer, for example. Using the stack layer as an implant mask, an ion implantation is carried out to form a buried bit line in the exposed substrate. A first photoresist layer is formed over the substrate. The first photoresist layer has a first line/distance pattern thereon. In this invention, the first line/distance pattern comprises a plurality of trenches running perpendicular to the buried bit line. The second dielectric layer and the stopping layer outside the first photoresist layer are removed to expose the first dielectric layer. Thereafter, the first photoresist layer is removed and a second photoresist layer is formed over the substrate. The second photoresist layer has a second line/distance pattern. The second line/distance pattern extends in a direction different from the first line/distance pattern. In this invention, the second line/distance pattern extends in a direction perpendicular to the first line/distance pattern. The second line/distance pattern comprises a plurality of trenches parallel to the buried bit line. Using the second photoresist layer and the stopping layer as an etching mask, a portion of the second dielectric layer and the first dielectric layer are removed to expose the substrate and the stopping layer. A gate oxide layer is formed over the exposed substrate. A word line is formed over the substrate in a direction perpendicular to the buried bit line, thereby forming a plurality of coding cells. Among the coding cells, the ones having a stack layer thereon are at a logic state "0" while the ones having a gate oxide layer thereon are at a logic state "1".

The mask ROM structure according to this invention is programmed not by a coding implant process. Hence, the problem of having coding ions diffusing into the buried bit line resulting in a reduction in the current-carrying capacity in the bit line is entirely eliminated.

In this invention, the memory cells inside the mask ROM structure are programmed through patterning the stack layer. Thus, the non-uniformity of critical dimensions in the isolated pattern regions and dense pattern regions resulting from using a conventional method to form a coding mask layer is prevented.

The mask ROM structure according to this invention is manufactured without using either the optical proximity correction method or the phase shift mask technique. Hence, cost of producing the mask ROM is lowered considerably.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Reference will now be made in detail to the present preferred embodiments of the invention, examples of which are illustrated in the accompanying drawings. Wherever possible, the same reference numbers are used in the drawings and the description to refer to the same or like parts.

Figure 1A:
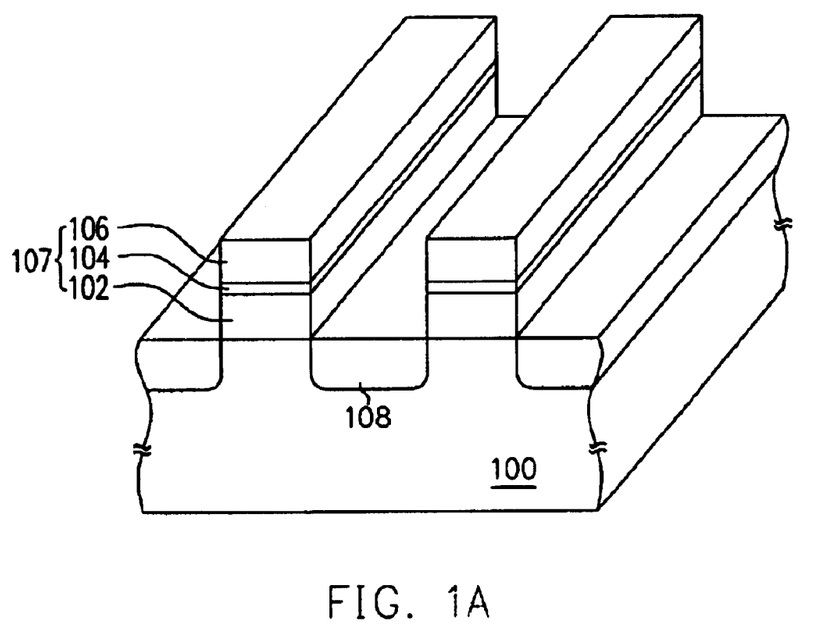
FIGS. 1A to 1F are sectional perspective views showing the progression of steps for producing a mask ROM according to one preferred embodiment of this invention.

FIGS. 1A to 1F are sectional perspective views showing the progression of steps for producing a mask ROM according to one preferred embodiment of this invention. As shown in FIG. 1A, a stack layer 107 comprising a first dielectric layer 102, a stopping layer 104 and a second dielectric layer 106 is formed over a substrate 100 to form a stack layer 107. The stack layer 107 is formed, for example, by sequentially depositing a first dielectric material, a stopping layer material and a second dielectric material over the substrate 100 and patterning the second dielectric layer, the stopping layer and the first dielectric layer in photolithographic and etching processes. In this embodiment, the first dielectric layer 102 and the second dielectric layer 106 are silicon oxide layers and the stopping layer 104 is a silicon nitride layer or a silicon oxynitride layer, for example. Furthermore, the first dielectric layer 102 preferably has a thickness between about 200 Å to 800 Å, the stopping layer 104 preferably has a thickness between about 20 Å to 80 Å and the second dielectric layer 106 preferably has a thickness between about 200 Å to 800 Å. Thereafter, using the stack layer 107 as an implant mask, an ion implantation is carried out to form a buried bit line 108 in the substrate 10 outside the stack layer 107.

Figure 1B:
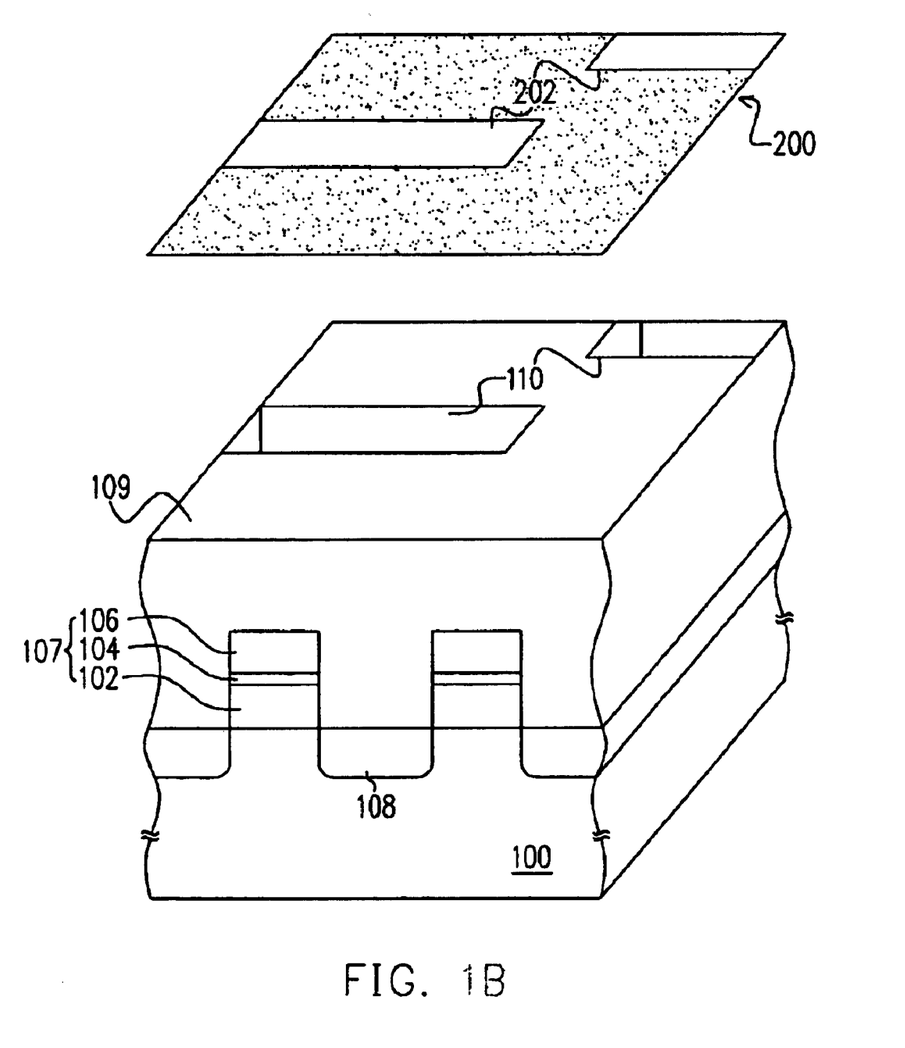

As shown in FIG. 1B, a photoresist layer 109 is formed over the substrate 100 covering the stack layer 107. A photomask 200 is placed over the photoresist layer 109. The photomask 200 includes a first line/distance pattern. Here, the first line/distance pattern on the photomask 200 comprises a plurality of rectangular opening patterns 202. A photolithographic process is conducted to transfer the pattern on the photomask 200 to the photoresist layer 109, thereby forming a first line/distance pattern in the photoresist layer 109. In this embodiment, the first line/distance pattern comprises a plurality of trenches 110 running in a direction perpendicular to the buried bit line 108 and the trenches 110 expose a portion of the stack layer 107.

Figure 1C:
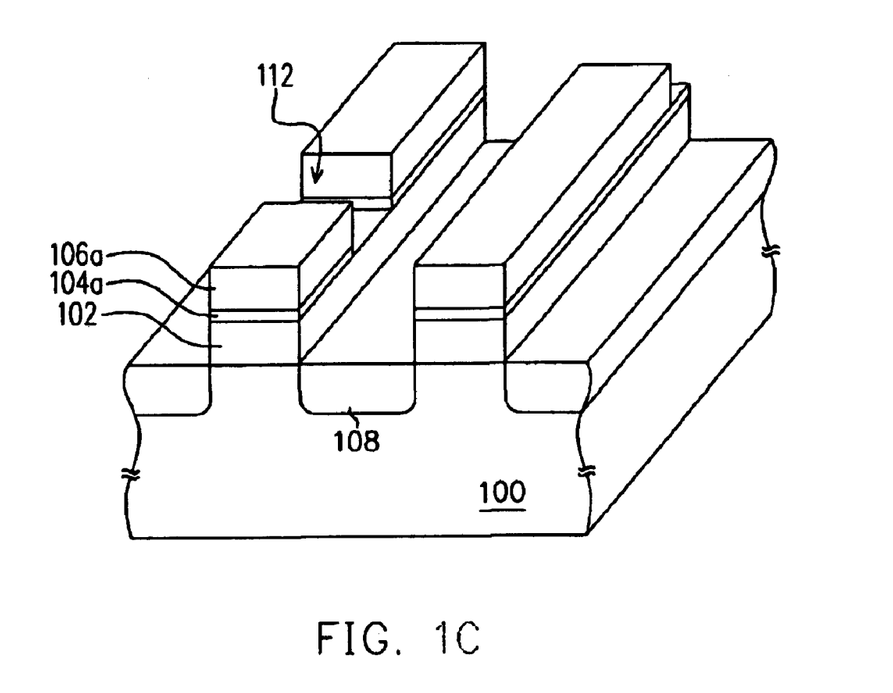

As shown in FIG. 1C, the exposed second dielectric layer 106 and the stopping layer 104 are etched using the photoresist layer 109 as an etching mask to form a patterned second dielectric layer 106a and a stopping layer 104a as well as an opening pattern 112 that exposes the first dielectric layer 102. The etching operation is a two-stage etching process that etches the second dielectric layer 106 and the stopping layer 104 separately. Since the etching rate between the stopping layer 104 and the second dielectric layer 106 are different and the etching rate between the first dielectric layer 102 and the stopping layer 104 are also different, etching will stop at the stopping layer 104 and the first dielectric layer 102 in each of the two-stage etching operations.

Figure 1D:
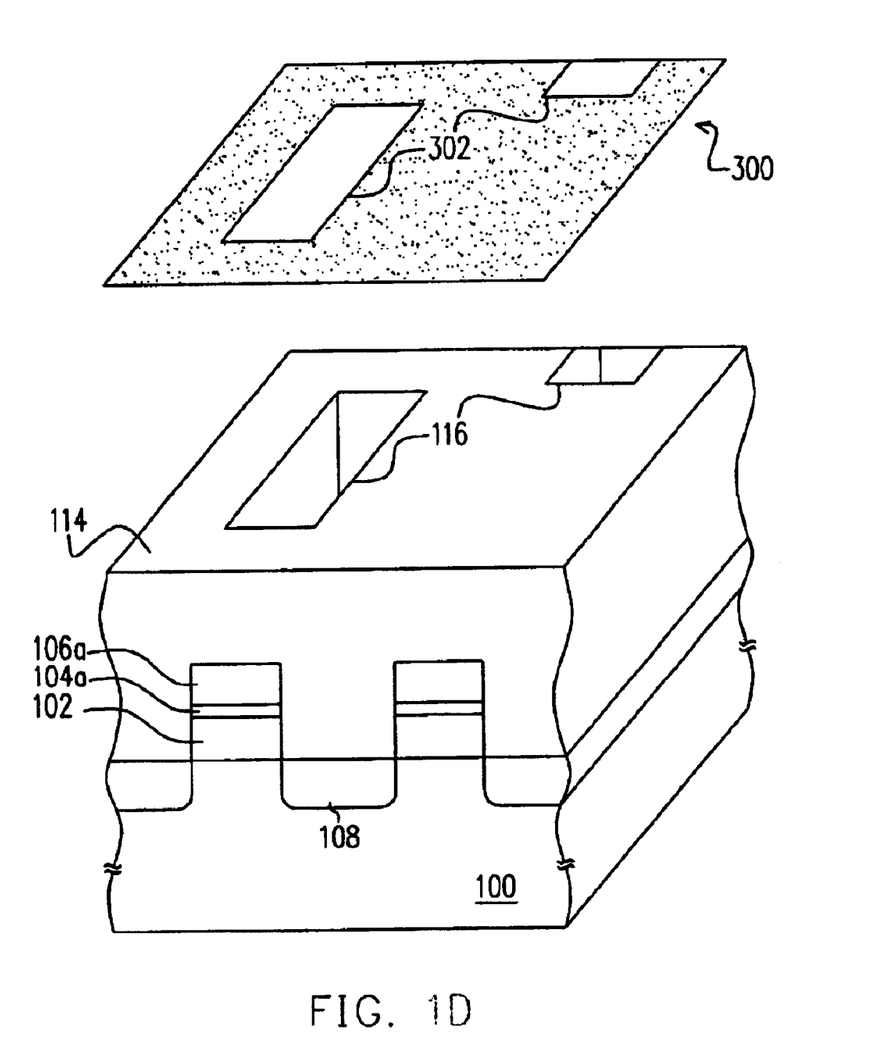

As shown in FIG. 1D, the photoresist layer 109 is removed. Another photoresist layer 114 is formed over the substrate 100. Another photomask 300 is placed over the photoresist layer 114. The photomask 300 has a second line/distance pattern thereon comprising a plurality of rectangular opening patterns 302. A photolithographic process is conducted to transfer the pattern on the photomask 300 to the photoresist layer 114, thereby forming a second line/distance pattern in the photoresist layer 114. The second line/distance pattern extends in a direction that differs from the first line/distance pattern. In this embodiment, the second line/distance pattern extends in a direction perpendicular to the first line/distance pattern. The second line/distance pattern comprises a plurality of trenches 116 running parallel to the buried bit line 108. The trenches 116 expose a portion of the first dielectric layer 102, a portion of the stopping layer 104a and a portion of the second dielectric layer 106a.

Figure 1E:
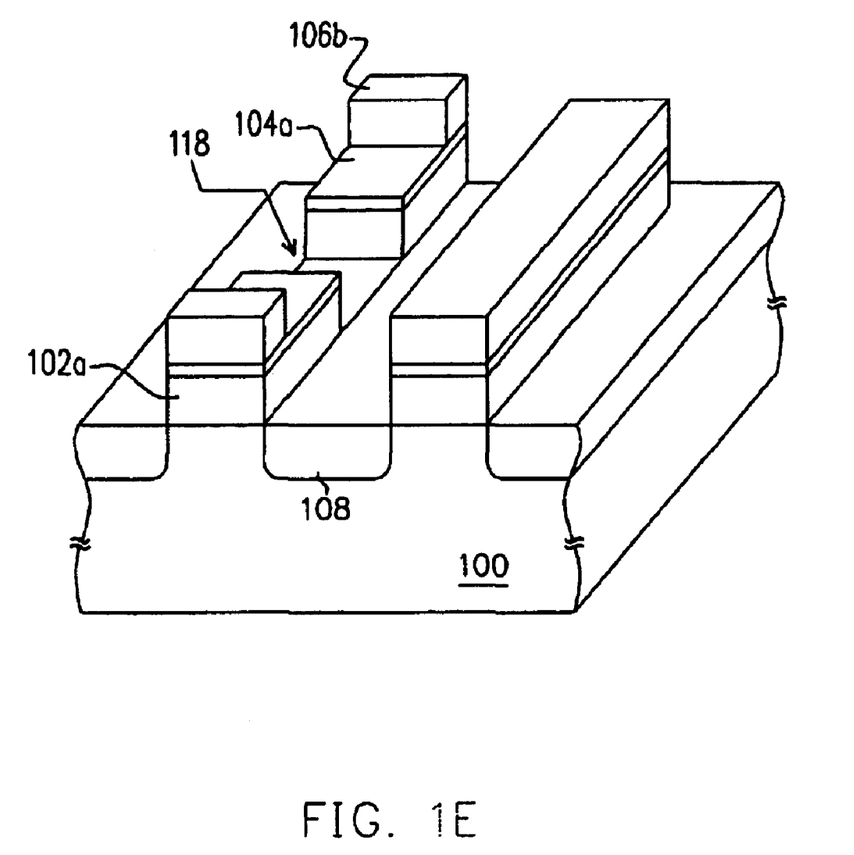

Using the photoresist layer 114 and the stopping layer 104a as an etching mask, the exposed second dielectric layer 106a and the first dielectric layer 102 in the trenches 116 is removed to form a patterned second dielectric layer 106b and a patterned first dielectric layer 102a. A T-shaped opening 118 that exposes the substrate 100 is also formed (as shown in FIG. 1E).

Figure 1F:
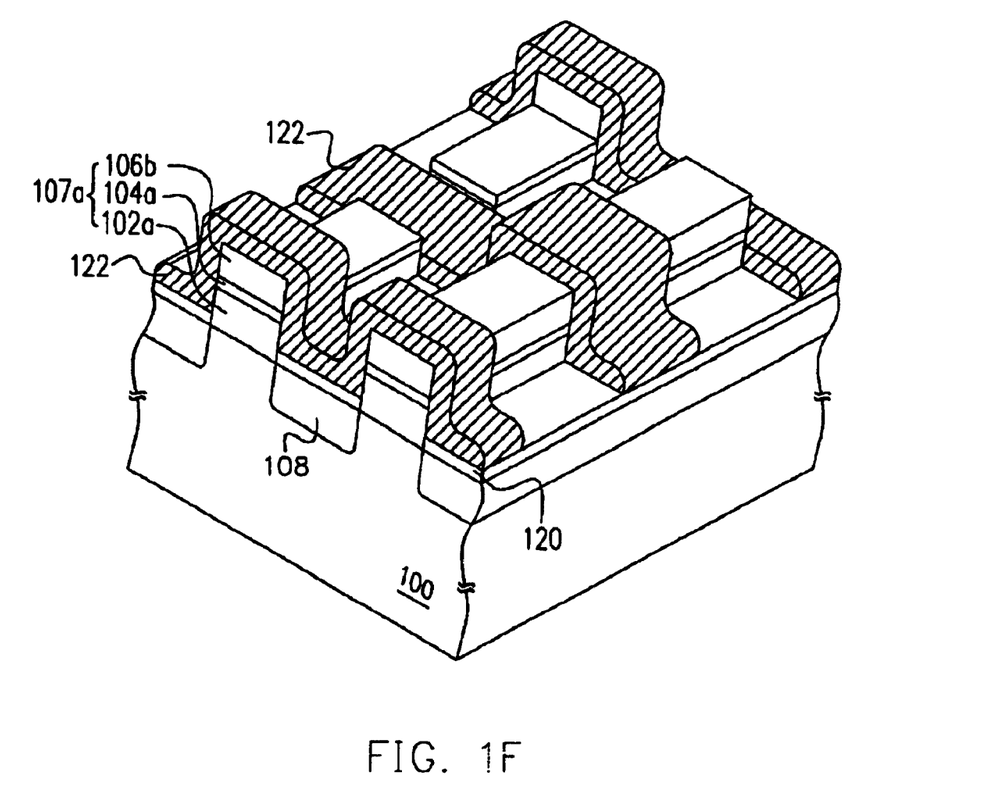
Figure 2:
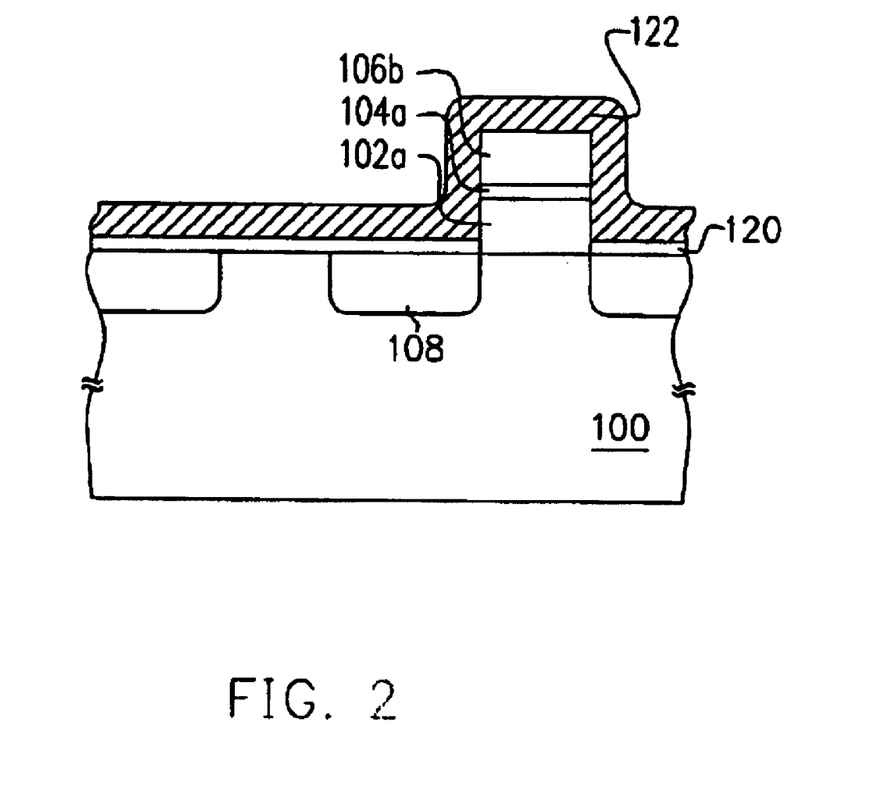
FIG. 2 is a cross-sectional view of a mask ROM cell according to one preferred embodiment of this invention.

Refer next to FIGS. 1F and 2. FIG. 2 is a cross-sectional view of the mask ROM cell according to one preferred embodiment of this invention. The photoresist layer 114 is removed. A gate oxide layer 120 is formed on the exposed surface of the substrate 100. The gate oxide layer 120 is formed, for example, by thermal oxidation. Thereafter, a word line 122 is formed over the substrate 100 in a direction perpendicular to the buried bit line 108, thereby forming a plurality of coding cells. Among the coding cells, the ones having a three-layered stack 107a including a first dielectric layer 102a, a stopping layer 104a and a second dielectric layer 106b are in a logic state "0". The other coding cells having no stack layer 107a thereon but a gate oxide layer 120 thereon are in a logic state "1".

In this invention, the mask ROM includes a substrate 100, a buried bit line 108, a patterned stack layer 107a, a gate oxide layer 120 and a word line 122. The buried bit line 108 is embedded inside the substrate 100. The stack layer 107a covers a portion of the upper surface of the substrate 100. The stack layer 107a comprises a first dielectric layer 102a, a stopping layer 104a and a second dielectric layer 106b. In this embodiment, the first dielectric layer 102a and the second dielectric layer 106b are made from silicon oxide material and the stopping layer 104a is made from silicon nitride or silicon oxynitride material, for example. In addition, the gate oxide layer 120 covers only the portion of the upper surface of the substrate 100 without any first dielectric layer 102a, stopping layer 104a and second dielectric layer 106b thereon. The word line 122 runs over the buried bit line 108 and forms a plurality of coding cells. Among these coding cells, the ones having a stack layer 107a thereon are at a logic state "0" while the ones having a gate oxide layer 120 thereon are at a logic state "1".

Note that the mask ROM fabricated according to this invention has a three-layered structure including the second dielectric layer 106b, the stopping layer 104a and the first dielectric layer 102a as well as a two-layered structure including the stopping layer 104a and the first dielectric layer 102a over the surface of the substrate 100 between two neighboring word lines 122.

In this invention, the memory cells inside the mask ROM structure are programmed through patterning the stack layer instead of a conventional coding implant process. Thus, the non-uniformity of critical dimensions in the isolated pattern regions and dense pattern regions resulting from using a conventionally manufactured coding mask is prevented.

Since the mask ROM structure according to this invention is not programmed by a conventional coding implant process, the problem of having coding ions diffusing into the buried bit line resulting in a reduction in the current-carrying capacity in the bit line is eliminated.

Moreover, a pair of masks each having a different line/distance pattern is used to pattern the stack layer so that openings having a dimension as small as 0.12 μm are easily formed in the stack layer.

In addition, the mask ROM structure according to this invention is manufactured without using either the optical proximity correction method or the phase shift mask technique. Thus, the cost of producing the mask ROM is lowered considerably.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a mask read-only-memory (ROM), comprising the steps of:
   providing a substrate;
   forming a first dielectric layer, a stopping layer and a second dielectric layer over the substrate to form a stack layer;
   forming a buried bit line in the substrate outside the stack-covered region;
   forming a first photoresist layer over the substrate, wherein the first photoresist layer includes a first line/distance pattern;
   removing the second dielectric layer and the stopping layer to expose the first dielectric layer using the first photoresist layer as a mask;
   removing the first photoresist layer;
   forming a second photoresist layer over the substrate, wherein the second photoresist layer includes a second line/distance pattern, and the second line/distance pattern extends in a direction that differs from the direction of extension of the first line/distance pattern;
   removing a portion of the second dielectric layer and the first dielectric layer to expose the substrate and the stopping layer using the second photoresist layer and the stopping layer as an etching mask;
   forming a gate oxide layer over the exposed substrate; and
   forming a word line perpendicular to the direction of extension of the buried bit line to construct a plurality of coding cells, wherein the coding cells having a stack layer thereon are at a first logic state while the coding cells having a gate oxide layer thereon are at a second logic state.

2. The method of claim 1, wherein the direction of extension of the first line/distance pattern is perpendicular to the direction of extension of the second line/distance pattern.

3. The method of claim 1, wherein the first line/distance pattern in the first photoresist layer includes a plurality of trenches perpendicular to the buried bit line.

4. The method of claim 1, wherein the second line/distance pattern in the second photoresist layer Includes a plurality of trenches parallel to the buried bit line.

5. The method of claim 1, wherein material forming the first dielectric layer and the second dielectric layer includes silicon oxide.

6. The method of claim 1, wherein material forming the stopping layer is selected from a group consisting of silicon nitride and silicon oxynitride.

7. The method of claim 1, wherein the first dielectric layer has a thickness between about 200 Å to 800 Å.

8. The method of claim 1, wherein the stopping layer has a thickness between about 20 Å to 80 Å.

9. The method of claim 1, wherein the second dielectric layer has a thickness between about 200 Å to 800 Å.

10. The method of claim 1, wherein the step of forming the buried bit line in the substrate includes conducting an ion implantation using the stack layer as an implant mask.

* * * * *